United States Patent
Kogetsu et al.

(10) Patent No.: US 7,955,581 B2
(45) Date of Patent: Jun. 7, 2011

(54) METHOD OF PRODUCING SILICON OXIDE, NEGATIVE ELECTRODE ACTIVE MATERIAL FOR LITHIUM ION SECONDARY BATTERY AND LITHIUM ION SECONDARY BATTERY USING THE SAME

(75) Inventors: Yasutaka Kogetsu, Osaka (JP); Sumihito Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 1130 days.

(21) Appl. No.: 11/580,117

(22) Filed: Oct. 13, 2006

(65) Prior Publication Data

US 2007/0099436 A1 May 3, 2007

(30) Foreign Application Priority Data

Oct. 14, 2005 (JP) ................. 2005-300137

(51) Int. Cl.
| | |
|---|---|
| C01B 15/14 | (2006.01) |
| C01B 33/20 | (2006.01) |
| C23C 4/04 | (2006.01) |
| C23C 8/00 | (2006.01) |
| C23C 14/28 | (2006.01) |
| C23C 14/10 | (2006.01) |
| C23C 16/00 | (2006.01) |
| H05H 1/24 | (2006.01) |
| H05B 3/00 | (2006.01) |
| B65B 33/00 | (2006.01) |
| C09D 5/20 | (2006.01) |
| B05D 5/12 | (2006.01) |

(52) U.S. Cl. ........ 423/325; 423/335; 427/452; 427/579; 427/585; 427/595; 427/154; 427/78; 427/255.27

(58) Field of Classification Search .................. 423/325, 423/335–340; 427/452, 579, 585, 595, 154, 427/78, 255.23, 255.27; 429/128, 218.1
See application file for complete search history.

(56) References Cited

U.S. PATENT DOCUMENTS

| | | | | |
|---|---|---|---|---|
| 4,795,688 | A | * | 1/1989 | Misumi et al. ................. 430/65 |
| 5,085,904 | A | * | 2/1992 | Deak et al. .................... 428/35.7 |
| 5,770,022 | A | * | 6/1998 | Chang et al. .................. 204/164 |
| 6,739,757 | B2 | * | 5/2004 | Kai et al. ....................... 384/488 |
| 6,759,160 | B2 | * | 7/2004 | Fukuoka et al. .............. 429/128 |

(Continued)

FOREIGN PATENT DOCUMENTS

| | | |
|---|---|---|
| JP | 6-325765 | 11/1994 |
| JP | 2002-260651 | 9/2002 |
| JP | 2004346354 A * | 12/2004 |

OTHER PUBLICATIONS

Tomozeiu et al. "Structural Properties of a-SiOx Layers Deposited by Reactive Sputtering Technique", Journal of Optoelectronics and Advanced Materials, vol. 4, No. 3, Sep. 2002, 513-521.*

(Continued)

*Primary Examiner* — Stanley Silverman
*Assistant Examiner* — Anthony J Zimmer
(74) *Attorney, Agent, or Firm* — McDermott Will & Emery LLP

(57) ABSTRACT

A method for producing a silicon oxide including the steps of supplying silicon atoms onto a substrate through an oxygen atmosphere to form a silicon oxide layer on the substrate, and separating the silicon oxide layer from the substrate and pulverizing the separated silicon oxide layer to obtain silicon oxide containing silicon and oxygen in predetermined proportions, and a negative electrode active material obtained by the production method.

6 Claims, 4 Drawing Sheets

U.S. PATENT DOCUMENTS

| | | | |
|---|---|---|---|
| 7,431,899 B2* | 10/2008 | Fukuoka et al. | 422/199 |
| 2001/0012503 A1* | 8/2001 | Fukuoka et al. | 423/335 |
| 2003/0215711 A1 | 11/2003 | Aramata et al. | |
| 2004/0166046 A1* | 8/2004 | Fukuoka et al. | 423/335 |
| 2004/0265210 A1 | 12/2004 | Shinohara et al. | |
| 2005/0048369 A1 | 3/2005 | Koshina et al. | |
| 2006/0099507 A1* | 5/2006 | Kogetsu et al. | 429/218.1 |

OTHER PUBLICATIONS

United States Office Action issued in U.S. Appl. No. 12/729,994, mailed Nov. 16, 2010.

United States Office Action issued in U.S. Appl. No. 12/729,994, mailed Mar. 17, 2011.

* cited by examiner

F I G. 1
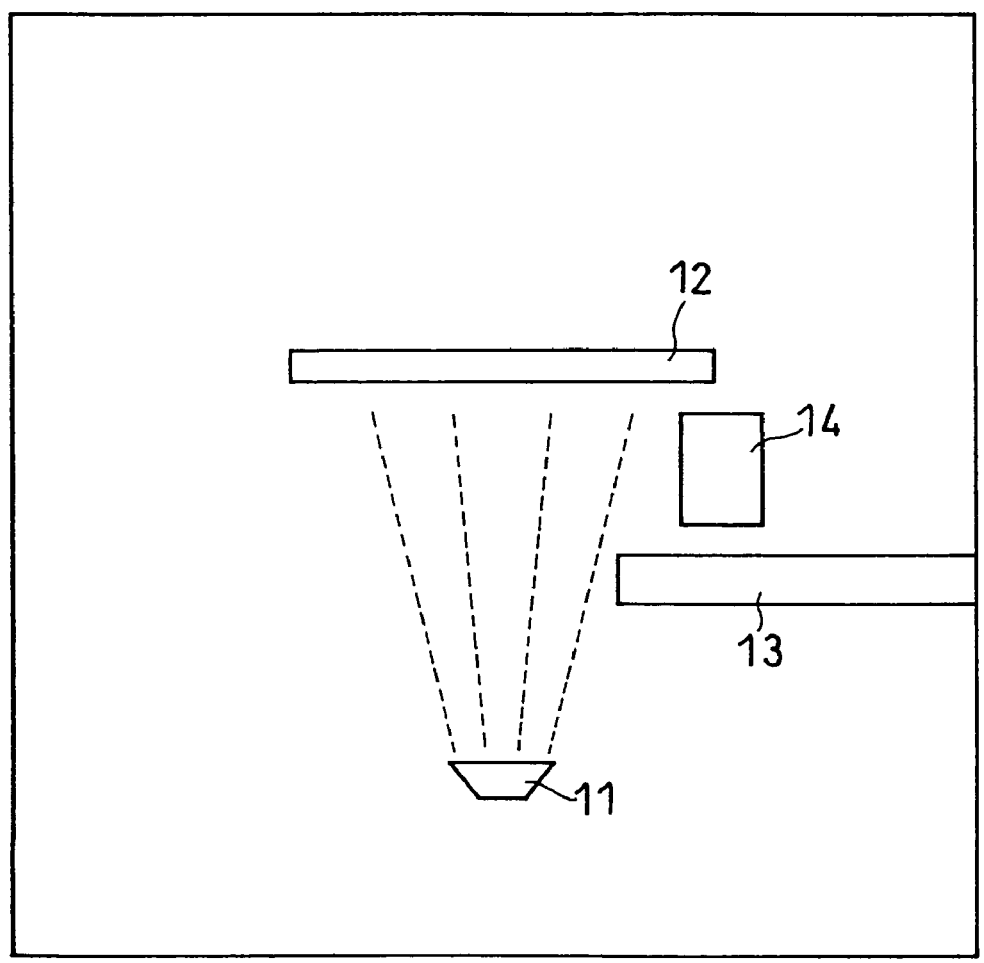

F I G. 2
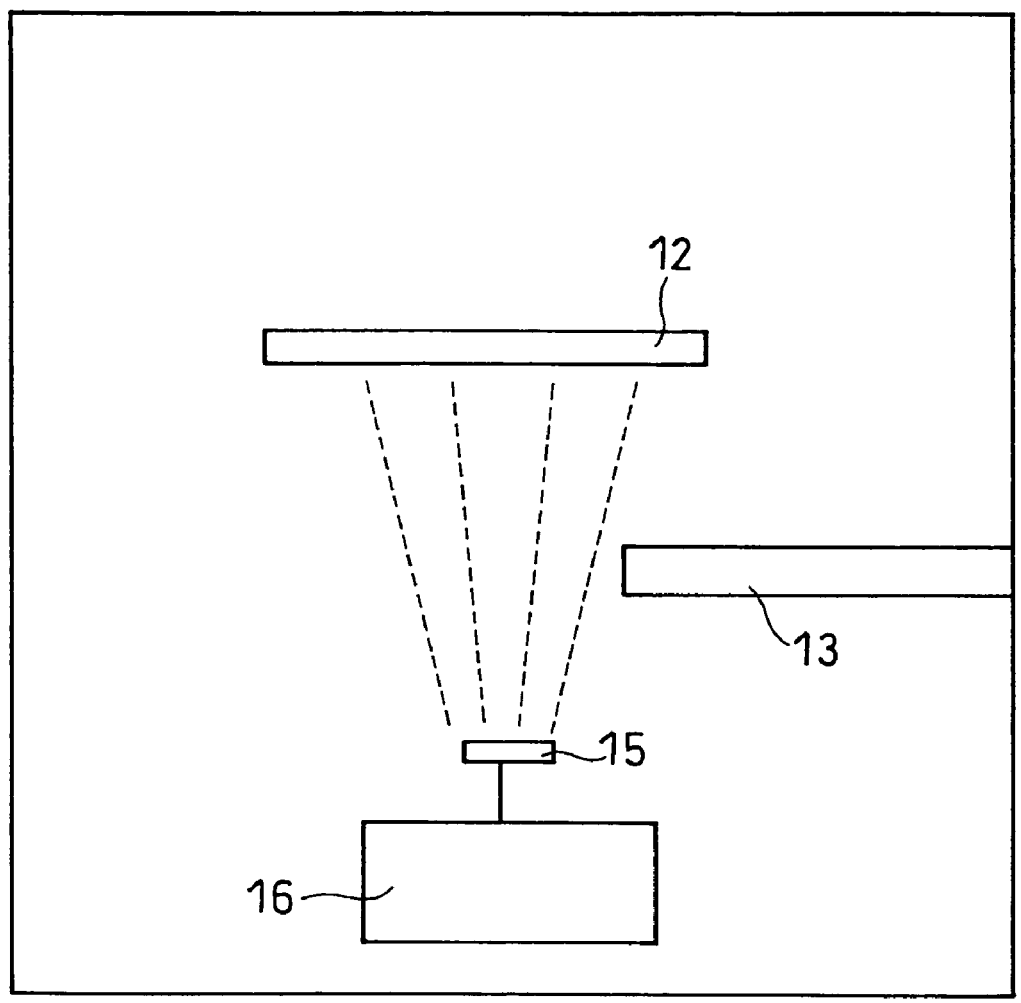

METHOD OF PRODUCING SILICON OXIDE, NEGATIVE ELECTRODE ACTIVE MATERIAL FOR LITHIUM ION SECONDARY BATTERY AND LITHIUM ION SECONDARY BATTERY USING THE SAME

FIELD OF THE INVENTION

The present invention relates mainly to a lithium ion secondary battery and, more particularly, to a negative electrode active material for a lithium ion secondary battery and a method of producing the material.

BACKGROUND OF THE INVENTION

Attention has been given to lithium ion secondary batteries as a power source for driving electronic equipment. For example, graphite materials have an average potential of about 0.2 V (vs. Li/Li$^+$) during desorption of lithium and, therefore, high-voltage lithium ion secondary batteries can be obtained by using graphite materials as a negative electrode active material. Further, graphite materials have a comparatively flat potential characteristic with respect to time during desorption of lithium. For these reasons, a lithium ion secondary battery containing a graphite material as a negative electrode active material is favorably used as a power source for a device which needs to have a high voltage and a flat voltage characteristic. Graphite materials, however, have a small capacity per unit mass of 372 mAh/g, and a further increase in capacity cannot be expected.

Silicon (Si), tin (Sn), oxides of Si and Sn and other materials capable of forming an intermetallic compound with lithium are considered promising as negative electrode materials which provide a higher capacity in comparison with graphite materials. However, the crystal structure of each of such materials is changed when the material absorbs lithium, resulting in a change in volume of the material. For example, in the case of Si, Si and Li form $Li_{4.4}Si$ when the amount of lithium absorbed in Si is maximized. The rate of increase in volume of Si with the change from Si to $Li_{4.4}Si$ is 4.12 times. In the case of absorption of lithium in graphite, on the other hand, the rate of increase in volume of graphite is 1.2 times even when the amount of absorption of lithium in graphite is maximized.

A large change in volume of an active material in the form of particles causes cracking of the active, material particles, imperfect contact between the active material and a current collector, etc., resulting in a reduction in charge/discharge cycle life. Particularly when cracking of active material particles occurs, the surface area of the active material particles increases and the reaction between the active material particles and a non-aqueous electrolyte is accelerated. As a result, a film derived from a component of the electrolyte is formed on the surface of the active material. Such a film increases the resistance between the active material and the electrolyte and is, therefore, considered as a major cause of a reduction in the charge/discharge cycle life of the battery.

To solve the above-described problem, a method of preventing a negative electrode active material from cracking by using $SiO_x$ ($0<x<2$) having an expansion coefficient during charge lower than that of silicon has been proposed (see Japanese Patent Laid-Open No. 6-325765).

A method of producing a silicon oxide having a low expansion coefficient has also been proposed (see Japanese Patent Laid-Open No. 2002-260651). According to Japanese Patent Laid-Open No. 2002-260651, silicon and silicon dioxide for example are mixed with each other and heated to generate SiO gas; the generated SiO gas and oxygen gas are mixed with each other; and the oxygen ratio x in $SiO_x$ is controlled to 1.05 to 1.5.

However, Japanese Patent Laid-Open No. 6-325765 includes no concrete description of an embodiment in which the oxygen ratio x in $SiO_x$ is controlled so as to satisfy $0<x<1$. The inventors of the present invention have further tested several methods described in the above publication as examples of production methods to find that none of them ensures that the oxygen ratio x in $SiO_x$ cannot be uniformly controlled so as to satisfy $0<x<1$.

For example, Japanese Patent Laid-Open No. 6-325765 discloses a method in which silicon dioxide and silicon are mixed with each other at a predetermined molar ratio and the mixture is heated in a nonoxidizing atmosphere or a vacuum. For example, if $SiO_2$ and Si are mixed and heated under reduced pressure, SiO gas is generated. SiO is produced by cooling SiO gas. When SiO is exposed to the atmosphere, the surface of SiO is oxidized by oxygen gas in the atmosphere and the molar ratio x of oxygen becomes higher than 1. That is, SiO is obtained and the obtained SiO is oxidized to increase the molar ratio x of oxygen. But the molar ratio x of oxygen cannot be reduced to 1 or less.

Japanese Patent Laid-Open No. 6-325765 also discloses a method in which $SiO_2$ is reduced by being mixed with carbon or a predetermined metal to control the oxygen ratio x. However, it is difficult to reduce $SiO_2$ so as to obtain the desired uniformity in oxygen ratio x. Therefore, $SiO_x$ cannot be obtained with a constant distribution of the oxygen ratio x. If the oxygen ratio x varies among different electrode plate portions, the amount of absorption of Li and the expansion coefficient when Li is absorbed vary, resulting in nonuniformity of the charge/discharge reaction in the electrode plate and deformation of the electrode plate.

In such a case, carbon or a metal used as a reducing agent remains as an impurity in its original form or in the form of a chemical compound such as SiC or $SiM_x$ (M: metal) in the electrode plate. Such an impurity has lower reactivity with lithium in comparison with $SiO_x$ and therefore reduces the capacity of the negative electrode.

Japanese Patent Laid-Open No. 6-325765 further discloses a method of oxidizing silicon by heating silicon together with oxygen gas. By this method, however, $SiO_x$ is generated inwardly from the silicon surface. Therefore, $SiO_x$ and an unoxidized Si portion coexist in each particle and it is not possible to form $SiO_x$ particles having a uniform oxygen distribution.

Each of lower silicon oxides obtained by production methods such as those disclosed in Japanese Patent Laid-Open No. 6-325765 and described above includes Si and silicon oxides such as SiO and $SiO_2$ other than the intended lower silicon oxide, the contents of these Si and silicon oxides being higher than 1 wt %. Thus, none of the production methods disclosed in Japanese Patent Laid-Open No. 6-325765 makes it possible to produce a high-purity silicon oxide.

The method disclosed in Japanese Patent Laid-Open No. 2002-260651 enables production of $SiO_x$ controlled so that the oxygen ratio x is 1.05 to 1.5, but does not enable the oxygen ratio x to be reduced to 1 or less. Also, the amount of absorption of Li in $SiO_x$ is small when the oxygen ratio x is 1.05 to 1.5. For this reason, the capacity of a negative electrode using the above-described silicon oxide as an active material is smaller than that in the case of using SiO.

Further, a negative electrode containing $SiO_x$ in which the oxygen ratio x is 1.05 to 1.5 has a large irreversible capacity and consumes part of the capacity of a positive electrode. The battery capacity is considerably reduced thereby.

For these reasons, the negative electrode described in Japanese Patent Laid-Open No. 2002-260651 is incapable of utilizing the characteristics of high-capacity silicon and obtaining the expected capacity.

BRIEF SUMMARY OF THE INVENTION

The present invention relates to a method for producing a silicon oxide, including the steps of supplying silicon atoms onto a substrate through an oxygen atmosphere to form a silicon oxide layer on the substrate, and separating the silicon oxide layer from the substrate and pulverizing the separated silicon oxide layer to obtain silicon oxide particles.

Preferably, in the above-described silicon oxide production method, the oxygen atmosphere contains oxygen gas, and the oxygen gas is converted to plasma. Preferably, the molar ratio of oxygen atoms to silicon atoms in the silicon oxide particles is 0.2 to 0.9.

The present invention also relates to a method for producing a negative electrode active material for a lithium ion secondary battery, including the steps of supplying silicon atoms onto a substrate through an oxygen atmosphere to form a silicon oxide layer on the substrate, and separating the silicon oxide layer from the substrate and pulverizing the separated silicon oxide layer to obtain silicon oxide particles, wherein the molar ratio x of oxygen atoms to silicon atoms in the silicon oxide particles is 0.2 to 0.9.

The present invention also relates to a negative electrode active material for a lithium ion secondary battery, including silicon oxide particles including a chemical compound expressed by $SiO_x$ ($0.2 \leq x \leq 0.9$), wherein the content of an impurity in the silicon oxide particles is 1 wt % or less. The impurity comprises an element other than silicon and oxygen, a chemical compound including the element, and a silicon oxide in which the oxygen ratio is not 0.2 to 0.9 (e.g., SiO and $SiO_2$), and a Si simple substance.

Preferably, in the above-described negative electrode active material for a lithium ion secondary battery, the average particle size of the silicon oxide particles is 0.5 to 20 μm.

Preferably, the negative electrode active material for a lithium ion secondary battery further includes carbon nanofibers and a catalyst element for promoting the growth of the nanofibers, and the carbon nanofibers bond to surfaces of the silicon oxide particles. Preferably, the catalyst element is at least one element selected from the group consisting of Cu, Fe, Co, Ni, Mo and Mn.

The present invention further relates to a lithium ion secondary battery having a positive electrode, a negative electrode containing the above-described negative electrode active material, a separator placed between the positive electrode and the negative electrode, and an electrolyte.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 1 is a diagram schematically showing an example of a vapor deposition apparatus used for production of a negative electrode active material for a lithium ion secondary battery in accordance with the present invention;

FIG. 2 is a diagram schematically showing an example of a sputtering apparatus used for production of a negative electrode active material for a lithium ion secondary battery in accordance with the present invention;

DETAILED DESCRIPTION OF THE INVENTION

Figure 3:
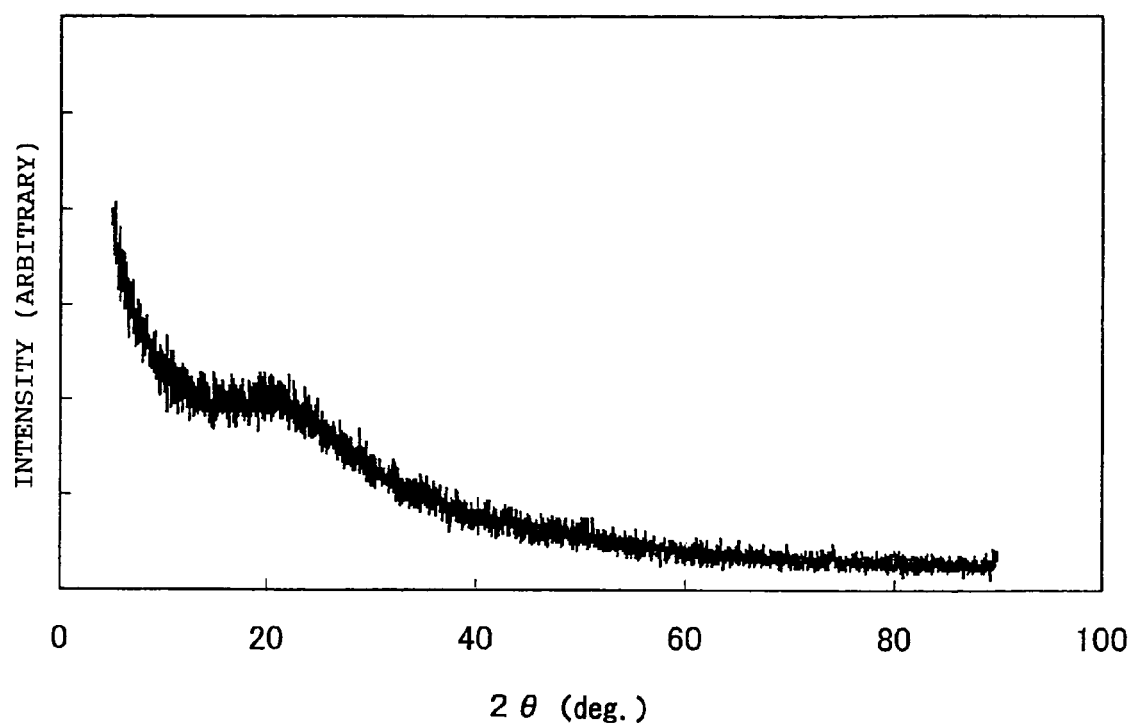
FIG. 3 is an X-ray diffraction chart when the negative electrode active material produced in Example 1 of the present invention was analyzed by an X-ray diffraction method.

The present invention proposes a production method capable of forming silicon oxide particles uniform in oxygen ratio and containing substantially no impurities by controlling to an arbitrary value the oxygen ratio in a negative electrode active material formed of silicon and oxygen. In a negative electrode active material for a lithium ion secondary battery produced by this production method, the molar ratio x of oxygen atoms to silicon atoms is set to, for example, 0.2 to 0.9 to optimize a balance between the expansion coefficient and the capacity of the active material.

The silicon oxide production method of the present invention includes a step (a) of supplying silicon atoms onto a substrate through an oxygen atmosphere, for example, by sputtering or vapor deposition method using only a silicon target to form a silicon oxide layer on the substrate, and a step (b) of separating the formed silicon oxide layer from the substrate and pulverizing the separated silicon oxide layer to obtain silicon oxide particles containing silicon and oxygen in predetermined proportions.

The production method of the present invention can be carried out, for example, by using a vapor deposition apparatus such as shown in FIG. 1 or a sputtering apparatus such as shown in FIG. 2.

The silicon oxide production method in the case of using the vapor deposition apparatus will first be described.

The vapor deposition apparatus shown in FIG. 1 has a substrate 12 and a silicon target 11 disposed in a vacuum chamber (not shown). In the vapor deposition apparatus shown in FIG. 1, the silicon target 11 is heated by an electron beam (EB) heater (not shown). An oxygen atmosphere exists between the substrate 12 and the silicon target 11.

When the silicon target 11 is heated, silicon atoms are evaporated and made to pass through the oxygen atmosphere to be supplied onto the current collector together with oxygen. A silicon oxide layer is gradually formed on the substrate 12 in this way.

The oxygen atmosphere may be constituted only of oxygen gas. The oxygen atmosphere may alternatively be constituted of a mixture gas formed of oxygen gas and a gas other than oxygen gas. Nitrogen gas, argon gas or the like for example may be used as a gas other than oxygen gas. Air may also be used as a gas constituting the oxygen atmosphere.

In the vapor deposition apparatus shown in FIG. 1, oxygen gas, for example, is released from an oxygen nozzle 13. Preferably, oxygen gas is supplied so that the oxygen concentration in the region through which evaporated silicon atoms pass is substantially constant. For example, the oxygen nozzle is disposed between the target and the substrate and the flow rate of oxygen gas released from the oxygen nozzle is controlled to substantially constantly maintain the oxygen concentration in the region through which evaporated silicon atoms pass.

As shown in FIG. 1, a device 14 for converting oxygen gas to plasma may be disposed in the vicinity of the oxygen nozzle 13. It is possible to accelerate the reaction between silicon and oxygen and increase the film forming rate by converting oxygen gas to plasma by means of the device 14 for converting oxygen gas to plasma. The production efficiency can be improved in this way. The device for converting oxygen gas to plasma is, for example, an electron beam irradiation device.

In the production method of the present invention, silicon and oxygen are mixed with each other on the atomic level or in a cluster formed by a plurality of atoms clustering together. Use of the production method of the present invention, therefore, ensures that a silicon oxide layer extremely uniform in oxygen ratio, which cannot be obtained by the conventional production method, can be formed.

The formed silicon oxide layer is separated from the substrate and pulverized. The pulverized silicon oxide can be used as a negative electrode active material for a lithium ion secondary battery.

The silicon oxide after pulverization may be classified to obtain silicon oxide particles of a predetermined size.

In some case, the amount of silicon atom vapor may be reduced at a position at a longer distance to the substrate 12 (film forming surface), i.e., at end portions of the substrate 12 shown in FIG. 1. That is, the oxygen ratio may vary between a central portion and the ends of the substrate 12 even when the oxygen concentration in the oxygen atmosphere is constant. It is, therefore, preferable to take a portion uniform in oxygen ratio out of the silicon oxide layer formed on the substrate.

The production method of the present invention can also be carried out by using a sputtering apparatus such as shown in FIG. 2 instead of the vapor deposition apparatus shown in FIG. 1. In FIG. 2, components identical or corresponding to those shown in FIG. 1 are indicated by the same reference numerals.

In the sputtering apparatus shown in FIG. 2, forming of a silicon oxide layer on a substrate 12 is also performed in a vacuum chamber (not shown), as is that in the vapor deposition apparatus shown in FIG. 1. An oxygen atmosphere exists between a target 15 and the substrate 12.

In the sputtering apparatus shown in FIG. 2, a sputtering gas such as argon gas is introduced into the vacuum chamber from sputtering gas supply piping (not shown) provided at a predetermined position. The sputtering gas is converted to plasma by an alternating current power supply 16, and the silicon target 15 is evaporated by the sputtering gas converted to plasma.

The evaporated silicon atoms pass through the oxygen atmosphere and are deposited on the substrate together with oxygen. Silicon and oxygen are mixed with each other on the atomic level or in a cluster, as are those in the vapor deposition apparatus shown in FIG. 1. As a result, a uniform silicon oxide layer is formed on the substrate.

In the sputtering apparatus of FIG. 2, when the sputtering gas is converted to plasma by the alternating current power supply 16, oxygen gas contained in the oxygen atmosphere is also converted to plasma. In use of the sputtering apparatus, therefore, there is no need to provide any special device for converting oxygen gas to plasma.

After the completion of the formation of the silicon oxide on the substrate, the formed silicon oxide is separated from the substrate and pulverized to obtain a negative electrode active material, as described above. Also in this case, the silicon oxide after pulverization may be classified.

As a material constituting the substrate, a hard metal of a high melting point, e.g., iron or stainless steel may be used. Stainless steel is more preferable. Use of the substrate made of such a material enables prevention of mixing of a constituent element of the substrate in the active material layer.

In the production method of the present invention, as described above, silicon atoms are made to pass through an oxygen atmosphere to be deposited on a substrate. A silicon oxide extremely uniform in oxygen ratio can therefore be formed. Further, the molar ratio of oxygen atoms to silicon atoms can be adjusted as desired, for example, by adjusting the concentration of oxygen gas contained in the oxygen atmosphere.

In the above-described production method, a silicon oxide to be provided as a negative electrode active material can be continuously formed in one vacuum chamber by using low-priced silicon as a target. Thus, the negative electrode can be produced efficiently at low cost.

Further, in the vapor deposition apparatus shown in FIG. 1 and the sputtering apparatus shown in FIG. 2, the probability of mixing of elements other than silicon and oxygen is extremely low. Also, since silicon atoms are made to pass through the oxygen atmosphere and are deposited on the substrate, the molar ratio of silicon atoms to oxygen atoms in the deposition layer can be made constant. Accordingly, the deposited material includes scarcely any of materials (e.g., Si, SiO and $SiO_2$) other than the silicon oxide to be obtained. Therefore, the amount of impurities can be limited to 1 wt % or less of the amount of silicon oxide.

Among silicon oxides ($SiO_x$) obtainable by the above-described production method, one in which the molar ratio x of oxygen to silicon (hereinafter referred to as oxygen ratio x) is in the range from 0.2 to 0.9 and in which the amount of impurities is 1 wt % or less is most suitable as a negative electrode active material. It is further preferred that the oxygen ratio x in the silicon oxide be in the range from 0.2 to 0.6.

If the oxygen ratio x is lower than 0.2, the capacity of the silicon oxide is large. However, the expansion coefficient at the time of reaction with lithium is large and, therefore, silicon oxide particles crack and become finer during repeated charge and discharge, resulting in a reduction in current collecting performance of the silicon oxide particles and deterioration in cycle characteristics. If the oxygen ratio x is higher than 0.9, the expansion coefficient of the silicon oxide at the time of reaction with lithium is small and, therefore, cracking of silicon oxide particles can be prevented. The silicon oxide has a reduced capacity under such a condition, so that the advantage of using silicon for a high capacity is not obtained.

The above-described silicon oxide has a reduced amount of impurities as described above and is, therefore, capable of further improving the battery capacity in comparison with the conventional negative electrode active materials.

Further, the silicon oxide produced by the above-described production method has substantially no variation in oxygen ratio x among particles and is, therefore, capable of preventing the reduction in capacity.

Consequently, the silicon oxide produced by the above-described production method and having an oxygen ratio of 0.2 to 0.9 and an amount of impurities of 1 wt % or less has a high capacity and improved cycle characteristics. Therefore, a lithium ion secondary battery having a high capacity and improved cycle characteristics can be provided by using the above-described silicon oxide as a negative electrode active material.

The average particle size of the above-described silicon oxide is preferably in the range from 0.5 to 20 μm, more preferably in the range from 1 to 10 μm. If the average particle size of the silicon oxide is smaller than 0.5 μm, the silicon oxide aggregates easily, so that handling of the silicon oxide becomes difficult and difficulty in production a negative electrode may be encountered. If the average particle size of the silicon oxide is larger than 20 μm, the particles can crack easily by expansion due to reaction with lithium and a reduction in current collecting performance and deterioration in cycle characteristics may result. The average particle size of the silicon oxide can be adjusted by classifying the silicon oxide after pulverization.

It is preferred that the oxygen ratio x be constant or generally constant among silicon oxide particles. Silicon oxide particles among which the oxygen ratio x is constant or generally constant can be obtained, for example, by taking a portion uniform in oxygen ratio out of the silicon oxide layer formed on the substrate and by pulverizing the portion taken out. If the oxygen ratio varies among the silicon oxide particles, the capacity varies from particle to particle. Nonuniformity of electrode reaction in the made negative electrode and a reduction in capacity may result. Further, the expansion coefficient varies among the particles, and deformation of the electrode plate and, hence, deformation of the battery may result.

There is a possibility of the outermost surfaces of silicon oxide particles being oxidized by oxygen gas existing in the atmosphere to generate an oxide film having an oxygen ratio x above the above-mentioned range. However, the thickness of the oxide film is extremely small and the oxide film does not impair the effect of the present invention.

It is preferred that the above-described silicon oxide be amorphous. That is, it is preferred that, in an X-ray diffraction chart obtained by X-ray diffraction measurement using Kα lines of Cu as a light source, the above-described silicon oxide have a broad peak of a half width value of 0.5° or more at a position of 2θ=20-40°. Crystalline silicon oxide is brittler than amorphous silicon oxide and cracks easily by expansion. For this reason, there is a possibility of deterioration in cycle characteristics of a battery using crystalline silicon oxide.

The oxygen ratio x can be controlled within the range from 0.2 to 0.9, for example, by adjusting the flow rate of oxygen gas released from the oxygen nozzle 13. The oxygen gas flow rate is determined on the basis of the capacity of the vacuum chamber, the evacuation power of a pump used to evacuate the vacuum chamber, the rate at which the target is evaporated, and other factors.

In the case of the vapor deposition apparatus, it is preferable to adjust the oxygen gas flow rate so that the pressure of oxygen gas in the vacuum chamber is, for example, in the range from $1 \times 10^{-5}$ to $5 \times 10^{-4}$ Torr. The preferable range of the oxygen gas pressure is thought to depend on the capacity of the vacuum chamber, the evacuation rate of the vacuum pump, the position of a pressure sensor in the vacuum chamber, Si deposition rate, and other factors.

If the oxygen gas pressure is higher than $5 \times 10^{-4}$ Torr, and if the vapor deposition apparatus has an EB heater, there is a possibility of electric discharge from the EB heater. If the oxygen gas pressure is lower than $1 \times 10^{-5}$ Torr, there is a need to reduce the Si deposition rate from the viewpoint of balance with the oxygen partial pressure. In this case, there is a possibility of a reduction in productivity.

In the case where the pressure of oxygen gas in the vacuum chamber is in the range from $1 \times 10^{-5}$ to $5 \times 10^{-4}$ Torr, it is preferred that the rate at which the target is evaporated, i.e., the amount of evaporation of silicon atoms per unit time, be 5 to 500 μg/s. The rate at which the target is evaporated can be adjusted, for example, by controlling the voltage for acceleration of the electron beam with which the silicon target is irradiated, the emission of the electron beam, the amount of the target used, the degree of vacuum in the chamber, and the size, the specific heat and the heat capacity of the crucible carrying the target.

In the case of the sputtering apparatus, it is preferred that the pressure of oxygen gas in the vacuum chamber is, for example, in the range from $1 \times 10^{-3}$ to $5 \times 10^{-3}$ Torr, and that the amount of evaporation of silicon atoms per unit time be $10 \times 10^{-2}$ to 3 μg/s. The amount of evaporation of silicon atoms can be controlled, for example, by adjusting the amount of the sputtering gas, the amount of $O_2$ and the radiofrequency output.

The oxygen ratio x and the characteristics of a battery are in a relationship described below. That is, when the oxygen ratio x is reduced, the capacity is increased while the expansion coefficient of the active material during reaction with lithium is increased. Conversely, when the oxygen ratio x becomes higher, the capacity is reduced while the expansion coefficient of the active material during reaction with lithium is reduced.

Details of the reaction between a silicon oxide and lithium have not been made clear up to now but are thought to be as follows.

Lithium bonds basically to silicon atoms. Therefore, when the oxygen ratio x is increased, the proportion of silicon capable of bonding to lithium is reduced, resulting in a reduction in capacity. If the amount of the bonded lithium is reduced, the volume expansion coefficient is also reduced. At the time of initial charge, lithium reacts with oxygen as well. This reaction is not reversible reaction. Therefore, this reaction can be a cause of an irreversible capacity. While it is not certain that the bond between oxygen and silicon is changed, oxygen is thought to have the effect of increasing the reversibility of reaction between silicon and lithium.

The amount of impurities contained in the silicon oxide is 1 wt % or less of the amount of the silicon oxide, as described above. If the silicon oxide contains more than 1 wt % of atoms other than silicon atoms and oxygen atoms, particularly carbon atoms, atoms of a metal element (e.g., zinc or aluminum) or the like, the capacity is reduced. It is thought that while oxygen increases the reversibility of reaction between silicon and lithium, the above-mentioned carbon and metal element atoms have no influence upon the reaction. Further, if a large amount of impurities such as Si, SiO and $SiO_2$ is contained, a portion having a different volume change rate during charge/discharge is generated in each silicon oxide particle. This means a possibility of cracking of the silicon oxide particle.

Conventionally, SiO and $SiO_2$ are well known as silicon oxides. In the case of production by any of the conventional production methods, it is extremely difficult to produce a silicon oxide in which the molar ratio of O to Si is lower than 1. A mixture of Si, SiO and $SiO_2$ is obtained in most cases. In the case of production by any of the conventional production methods, therefore, it is extremely difficult to produce a silicon oxide in which the oxygen ratio x is smaller than 1 and the amount of impurities is 1 wt %.

In the present invention, the negative electrode active material may include, in addition to the above-described silicon oxide particles, carbon nanofibers and a catalyst element for promoting the growth of carbon nanofibers. It is preferred that the carbon nanofibers bond to the surfaces of the silicon oxide particles. The carbon nanofibers expand or contact according to the change in volume when the silicon oxide particles expand or shrink. If the negative electrode active material has carbon nanofibers, the electron conductivity can be improved.

It is preferable to directly grow carbon nanofibers on the surfaces of the silicon oxide particles, because the silicon oxide particles and the carbon nanofibers are thereby firmly bonded to each other.

In a case where carbon nanofibers are directly grown on the surfaces of silicon oxide particles, the bond between the silicon oxide particles and the carbon nanofibers is not a bond by means of a resin component but the very chemical bond. Therefore, the bond between the silicon oxide particles and the carbon nanofibers is not easily cut even during repeated expansion and shrinkage of the silicon oxide particles, thus reducing the possibility of cutting of the electron conduction network. As a result, high electron conductivity is ensured and good cycle characteristics can be obtained.

In the present invention, "catalyst element" refers to an element capable of promoting the growth of carbon nanofibers. At least one element selected from the group consisting of Cu, Fe, Co, Ni, Mo and Mn can be used as the above-described catalyst element.

It is preferred that the catalyst element be carried on the silicon oxide. Examples of a method of providing the catalyst element on the silicon oxide, not particularly specified, are a method of providing the simple substance of the catalyst element and a method of providing a compound containing the catalyst element. The latter is easier to carry out. The compound containing the catalyst element is not particularly specified. For example, an oxide, a carbide, a nitrate or the like can be used as the compound containing the catalyst element. The compound containing the catalyst element undergoes reduction after being carried on the silicon oxide. Thus, the catalyst element is provided on the surface of the silicon oxide.

The catalyst element can be regarded as an impurity contained in the silicon oxide. Also in this case, it is preferred that the amount of the catalyst element be 1 wt % or less of the amount of silicon oxide.

SiC not contributing to the capacity is formed at the interface between the carbon nanofibers and the silicon oxide particles. However, the amount of generation of SiC is extremely small and, therefore, no substantial reduction in battery capacity is caused by SiC.

The above-described negative electrode active material can be used as a negative electrode active material for a lithium ion secondary battery.

A lithium ion secondary battery of the present invention includes a negative electrode containing the above-described negative electrode active material, a positive electrode containing a positive electrode active material, a separator placed between the positive and negative electrodes, and an electrolyte.

The negative electrode may be formed only of a negative electrode active material layer including the above-described negative electrode active material or may be formed of a negative electrode current collector and a negative electrode active material layer carried on the negative electrode current collector. The negative electrode active material layer may contain a binder and a conductive agent in addition to the negative electrode active material.

Similarly, the positive electrode may be formed only of a positive electrode active material layer including the positive electrode active material or may be formed of a positive electrode current collector and a positive electrode active material layer carried on the positive electrode current collector. The positive electrode active material layer may contain a binder and a conductive agent in addition to the positive electrode active material.

As the binder for the positive and negative electrodes, a material well known in the art can be used. Examples of such a material include polyvinylidene fluoride and polytetrafluoroethylene. Preferably, the amount of the binder is 0.5 to 10 parts by weight per 100 parts by weight of the active material.

As the conductive agent for the positive and negative electrodes, a material well known in the art can be used. Examples of such a material include acetylene black, ketjen black and various graphites. These materials may be used singly or in combination of two or more of them. Preferably, the amount of the conductive agent is 0.1 to 10 parts by weight per 100 parts by weight of the active material.

A material constituting the negative electrode current collector may be one well known in the art. Such a material is, for example, copper.

As the positive electrode active material, a lithium containing composite oxide such as lithium cobalt oxide for example can be used.

A material constituting the positive electrode current collector may be one well known in the art. Such a material is, for example, aluminum.

The negative electrode can be made, for example, by preparing a negative electrode material mixture paste containing a negative electrode active material, a binder, a conductive agent and a dispersion medium, by applying the material mixture paste to the current collector and by drying the material mixture paste. The positive electrode can be made in the same manner as the negative electrode.

As a material constituting the separator, a material well known in the art can be used. Examples of such a material include polyethylene, polypropylene, a mixture of polyethylene and polypropylene, and a copolymer of ethylene and propylene. Preferably, the thickness of the separator is set to 10 to 40 µm from the viewpoint of increasing the energy density while maintaining the desired ion conductivity.

The electrolyte comprises a non-aqueous solvent and a solute dissolved in the solvent. Examples of the non-aqueous solvent include ethylene carbonate, propylene carbonate, dimethyl carbonate, diethyl carbonate, and methyl ethyl carbonate. The non-aqueous solvent is not limited to these materials. These non-aqueous solvents may be used singly or in combination of two or more of them.

Examples of the solute include $LiPF_6$, $LiBF_4$, $LiCl_4$, $LiAlCl_4$, $LiSbF_6$, $LiSCN$, $LiCl$, $LiCF_3SO_3$, $LiCF_3CO_2$, $Li(CF_2SO_2)_2$, $LiAsF_6$, $LiN(CF_3SO_2)_2$, $LiB_{10}CL_{10}$ and imides. They may be used singly or in combination of two or more of them.

The shape of the lithium ion secondary battery is not particularly specified. For example, it may be of a coin type, a sheet type or a rectangular block type. Also, the lithium ion secondary battery may be a large battery for use in an electric motor vehicle or the like. The electrode group included in the lithium ion secondary battery may be of a laminated type or a wound type.

The present invention will be described in detail on the basis of examples thereof.

EXAMPLE 1

(Battery 1)
(Production of Positive Electrode)

With 100 parts by weight of lithium cobalt oxide ($LiCoO_2$) having an average particle size of 5 µm was mixed, 3 parts by weight of acetylene black as a conductive material to prepare a mixture. The mixture thereby obtained and an N-methyl-2-pyrrolidone (NMP) solution in which polyvinylidene fluoride (PVdF) provided as a binder was dissolved were kneaded to obtain a paste containing a positive electrode material mixture. The NMP solution in which PVdF was dissolved was added so that 4 parts by weight of PVdF was contained in the obtained paste.

This paste was applied to one surface of a positive electrode current collector made of aluminum foil (thickness: 14 µm), dried and rolled to form a positive electrode active material layer, thus obtaining a positive electrode plate sheet.

From the obtained positive electrode plate sheet, a circular positive electrode having a diameter of 1 cm was cut out.

(Production of Negative Electrode)

A negative electrode active material, acetylene black provided as a conductive agent, polyvinylidene fluoride provided as a binder and a suitable amount of NMP were kneaded to obtain a paste containing a negative electrode material mixture. The obtained paste was applied to one surface of a negative electrode current collector made of copper foil (thickness: 18 μm) by a doctor blade method and was sufficiently dried to form a negative electrode active material layer, thus obtaining a negative electrode plate sheet.

From the obtained negative electrode plate sheet, a circular negative electrode having a diameter of 1.1 cm was cut out. The amount of application of the paste to the negative electrode current collector was adjusted in advance so that the weight of the active material contained in the negative electrode active material layer was 3 mg.

(Production of a Coin-Type Test Cell)

Figure 4:
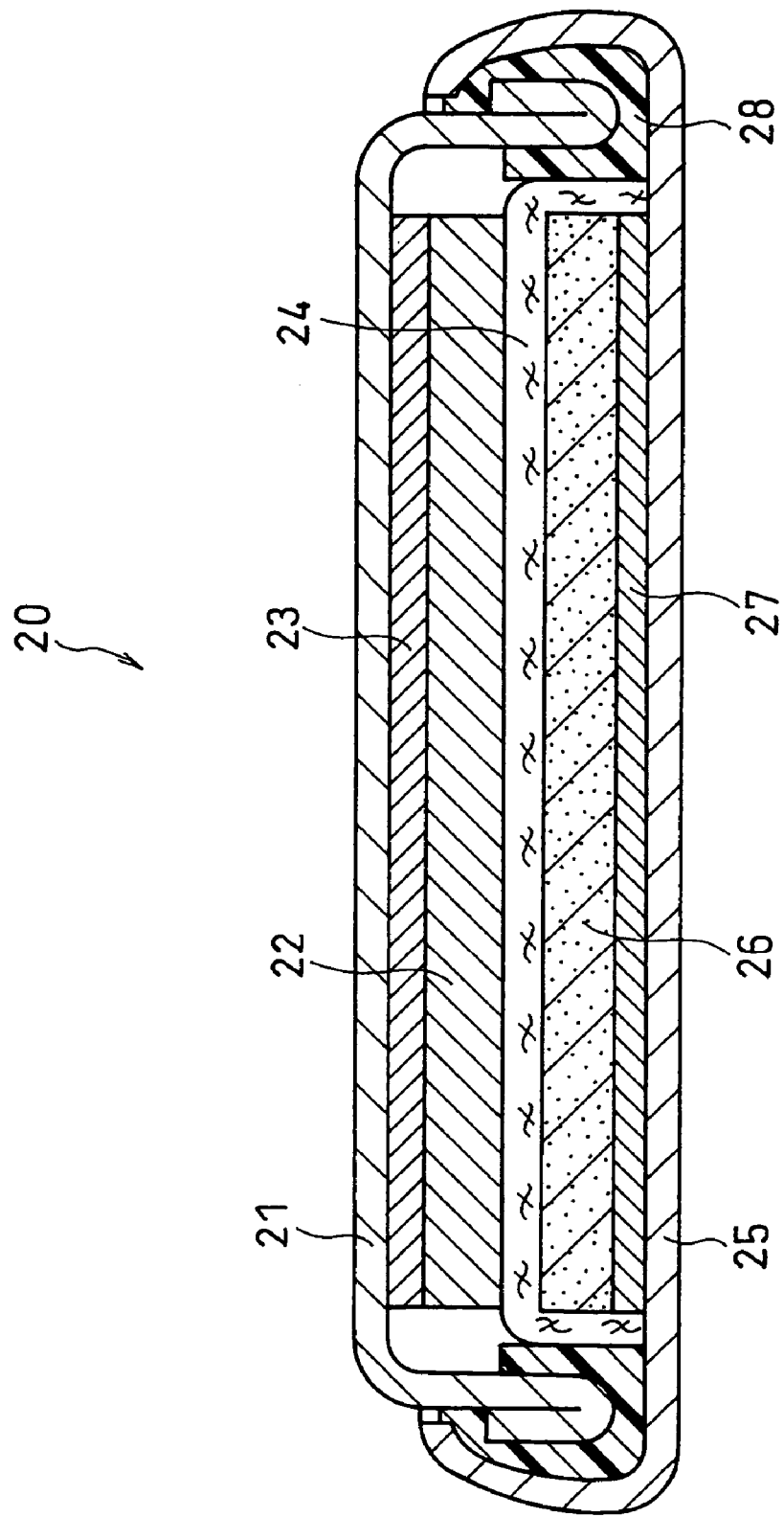
FIG. 4 is a schematic longitudinal sectional view of a coin-type cell made in Examples of the present invention.

A coin-type test cell 20 shown in FIG. 4 was made by using the positive and negative electrodes made as described above.

The positive electrode formed of a positive electrode current collector 27 and a positive electrode material mixture 26 was placed on an inner bottom surface of a positive electrode case 25. Subsequently, a separator 24 (thickness: 27 μm) formed of a porous polyethylene sheet punched into a circular shape was placed on the positive electrode 26 as to cover the same. Thereafter, the positive electrode and the separator 24 are impregnated with an electrolyte. The electrolyte was prepared by dissolving lithium hexafluorophosphate (LiPF$_6$) at a concentration of 1 mol/l in a mixture solvent in which ethylene carbonate and diethyl carbonate were mixed in proportions of 1:1 (volume ratio).

Subsequently, the negative electrode formed of a negative electrode material mixture 22 and a negative material current collector 23 was placed on the separator 24. A sealing plate 21 having an insulating packing 28 on its peripheral portion was placed on the negative electrode current collector 23, and the opening end portion of the case 25 was crimped on the insulating packing 28 to complete the coin-type test cell 20.

(Production of Negative Electrode Active Material)

A method of producing the negative electrode active material will next be described. The negative electrode active material was produced by using a vapor deposition apparatus (available from ULVAC, Inc.) provided with an EB heater (not shown) for heating a target, a gas piping (not shown) for introducing oxygen gas into the vacuum chamber, an oxygen nozzle and other components, as shown in FIG. 1.

As a gas constituting an oxygen atmosphere, oxygen gas having a purity of 99.7% (available from Nippon Sanso Corporation) was used. The oxygen gas was released from the oxygen nozzle 13 at a flow rate of 80 sccm. The pressure of the oxygen gas in the vacuum chamber was $2.2 \times 10^{-4}$ Torr.

A mass flow controller was provided between an oxygen bomb containing oxygen gas and the gas piping led to the interior of the vacuum chamber. The oxygen nozzle 13 was connected to the gas piping.

As a target 11, silicon having a purity of 99.9999% (available from Kojundo Chemical Laboratory Co., Ltd.) was used. The voltage for acceleration of the electron beam (EB) with which the silicon target 11 was irradiated was set to −8 kV and the emission of the EB was set to 500 mA.

Silicon was heated by an EB heater to evaporate silicon atoms. Silicon atoms passed through the oxygen atmosphere and a silicon oxide was deposited on a substrate 12 made of stainless steel. Deposition of the silicon oxide was performed for 60 minutes. The silicon oxide was thus formed on the substrate 12. Thereafter, the silicon oxide layer was separated from the substrate, pulverized and classified to obtain a negative electrode active material having an average particle size of 2 μm.

The constituent elements of the negative electrode active material were analyzed by fluorescence X-ray analysis. Only peaks associated with silicon and oxygen were thereby obtained, while signals for other elements are below the detection limit. Further, the oxygen ratio was computed by a fundamental parameter method to obtain the composition of the negative electrode active material. It was thereby found that the composition of the negative electrode active material was $SiO_{0.6}$. The negative electrode active material was also analyzed by a combustion method to obtain the composition of the negative electrode active material. Also in this case, the same composition was found. The combustion method is a method in which a specimen is molten and superheated in a graphite crucible and CO gas thereby produced is measured by a non-dispersive infrared absorption method to determine the amount of oxygen contained in the specimen. Determination of the amount of oxygen by the combustion method can be made, for example, by using an oxygen analysis apparatus (MEGA-620W from Horiba, Ltd.).

The amount of impurities contained in the negative electrode active material was measured with an inductively-coupled plasma (ICP) mass analysis apparatus to fine that the amount was below the measurement limit. The measurement limit of the apparatus used for this measurement was 10 ppm (0.001 wt %).

FIG. 3 shows an X-ray diffraction chart showing the results of analysis of the obtained negative electrode active material by X-ray diffractometry (XRD) using Kα lines of Cu.

There was no diffraction peak indicating the existence of a crystal and, therefore, no element was identified. A broad halo pattern was observed in a region of $2\theta=10\text{-}35°$ in the obtained X-ray diffraction chart. It is thought that this broad halo pattern is due to the amorphous state of the negative electrode active material.

The contents of impurities such as Si and $SiO_2$ (or oxides of Si) can be examined by using an X-ray diffractometry (XRD) and/or X-ray photoemission spectroscopy (XPS).

The battery made by using the above-described negative electrode active material is denoted as battery 1.

(Comparative Battery 1-1)

SiO (available from Kojundo Chemical Laboratory Co., Ltd.) was pulverized and classified to obtain silicon oxide particles having an average particle size of 2 μm. Comparative battery 1-1was made in the same manner as Battery 1 except that the silicon oxide particles were used as a negative electrode active material.

(Comparative Battery 1-2)

Comparative battery 1-2 was made in the same manner as Battery 1 except that silicon oxide particles obtained by partially reducing silicon dioxide as described below were used as a negative electrode active material.

30 g (0.5 mol) of silicon dioxide powder (available from Kojundo Chemical Laboratory Co., Ltd.) and 4.2 g (0.35 mol) of carbon powder were mixed with each other and the mixture of these materials was put in a reactor. The reactor was filled with argon gas and was thereafter operated to heat the mixture at 1200° C. for 5 hours to obtain a mass of black material. Heating was performed by causing argon gas to flow at a rate of 500 cc per minute in the reactor.

The obtained mass of black material was pulverized and classified to obtain 10 g of active material. The average particle size of the obtained active material was 5 μm.

This active material was analyzed by fluorescence X-ray method to detect silicon, oxygen and carbon. The amounts of silicon, oxygen and carbon contained in the obtained active material were determined by a fundamental parameter method. It was thereby confirmed that the composition of the obtained active material was $SiO_{0.7}C_{0.1}$.

Further, the active material was analyzed by X-ray diffractometry (XRD) using Kα lines of Cu. Peaks of Si and SiC were thereby observed. It was therefore determined that the obtained active material was not a uniform material but a mixture of Si, $SiO_x$ and SiC.

<Evaluation>

(Initial Capacity and Charge/Discharge Efficiency)

Each of battery 1 and comparative Batteries 1-1 to 1-2 was charged at a constant current of 0.5 mA at an ambient temperature of 25° C. until the battery voltage of 4.2 V was reached. After a lapse of a rest time of 20 minutes, the charged battery was discharged at a constant current of 0.5 mA until the battery voltage decreased to 2.5 V. The discharge capacity at this time was obtained as an initial capacity. Also, the ratio of the discharge capacity (initial capacity) to the charge capacity expressed in percentage was obtained as charge/discharge efficiency. Table 1 shows the results of this evaluation.

(Capacity Retention Rate)

The capacity retention rate of each battery was measured with respect to cycle characteristics.

Each battery was charged at a constant current of 0.5 mA at an ambient temperature of 25° C. until the battery voltage of 4.2 V was reached. After a lapse of a rest time of 20 minutes, the charged battery was discharged at a constant current of 0.5 mA until the battery voltage decreased to 2.5 V. This charge/discharge cycle was repeated 30 times. The ratio of the discharge capacity obtained at the 30th cycle to the initial capacity expressed in percentage was obtained as the capacity retention rate. Table 1 shows the results of this evaluation.

TABLE 1

|  | Initial capacity (mAh) | Charge/discharge efficiency (%) | Capacity retention rate (%) |
| --- | --- | --- | --- |
| Battery 1 | 3.6 | 72 | 85 |
| Comp. Battery 1-1 | 2.4 | 50 | 60 |
| Comp. Battery 1-2 | 1.9 | 50 | 50 |

As can be understood from Table 1, battery 1 had a higher initial capacity and a higher charge/discharge efficiency and also had improved cycle characteristics. On the other hand, comparative batteries 1-1 and 1-2 had initial capacities and charge/discharge efficiencies lower than those of battery 1, and were also inferior in cycle characteristics to battery 1.

The oxygen ratio x in the silicon oxide used in battery 1 was 0.6 and smaller than the oxygen ratio x of the silicon oxide used in comparative battery 1-1. Further, the silicon oxide used in battery 1 had substantially no impurities mixed therein and was uniform in oxygen ratio. Because of these factors, battery 1 is thought to have improved battery characteristics in comparison with the comparative batteries. In this example and also in examples 2 to 6 described below, the amount of impurities contained in the negative electrode active material was 1 wt % or less.

The negative electrode active material contained in comparative battery 1-2 had an oxygen ratio lower than that in the negative electrode active material in comparative battery 1-1, but its initial capacity was lower than that of comparative battery 1-1. Further, the charge/discharge efficiency and the capacity retention rate of comparative battery 1-1 were markedly interior to those of battery 1. It is inferred that the reductions in initial capacity, charge/discharge efficiency and capacity retention rate of comparative battery 1-2 were due to the generation of a mixture of silicon, silicon monoxide and silicon dioxide resulting from reduction of only portions where the carbon powder and the silicon dioxide powder contact, and due to the partial formation of SiC resulting from reaction between silicon and carbon.

EXAMPLE 2

In this example, the vapor deposition apparatus shown in FIG. 1 was used and the oxygen ratio x in the negative electrode active material was changed by changing the flow rate of oxygen introduced into the vacuum chamber.

(Battery 2-1)

Battery 2-1 was made in the same manner as battery 1 except that the oxygen gas flow rate when the negative electrode active material was produced was 13 sccm, and that the thickness of the positive electrode active material layer was 1.6 times larger than that of the positive electrode active material layer in battery 1. The pressure in the vacuum chamber during the production of the negative electrode active material was $8 \times 10^{-5}$ Torr.

The oxygen ratio in the obtained negative electrode active material was measured by the combustion method to obtain the composition of the negative electrode active material. The composition of the negative electrode active material was $SiO_{0.1}$.

(Battery 2-2)

Battery 2-2 was made in the same manner as battery 1 except that the oxygen gas flow rate when the negative electrode active material was produced was 26 sccm, and that the thickness of the positive electrode active material layer was 1.6 times larger than that of the positive electrode active material layer in battery 1. The pressure in the vacuum chamber during the production of the negative electrode active material was $1 \times 10^{-4}$ Torr.

The composition of the obtained negative electrode active material was obtained by the same method as that described above. The composition of the negative electrode active material was $SiO_{0.2}$.

(Battery 2-3)

Battery 2-3 was made in the same manner as battery 1 except that the electron beam emission was set to 400 mA.

The composition of the obtained negative electrode active material was obtained by the same method as that described above. The composition of the negative electrode active material was $SiO_{0.9}$.

(Battery 2-4)

Battery 2-4 was made in the same manner as battery 1 except that the electron beam emission was set to 300 mA.

The composition of the obtained negative electrode active material was obtained by the same method as that described above. The composition of the negative electrode active material was $SiO_{1.1}$.

The initial capacities, charge/discharge efficiencies and capacity retention rates of batteries 2-1 to 2-4 were measured in the same manner as in EXAMPLE 1. Table 2 shows the obtained results. The oxygen ratio x in the silicon oxide is also shown in Table 2. The results of battery 1 are also shown in Table 2.

TABLE 2

|  | Oxygen ratio x | Initial capacity (mAh) | Charge/discharge efficiency (%) | Capacity retention rate (%) |
| --- | --- | --- | --- | --- |
| Battery 1 | 0.6 | 3.6 | 72 | 85 |
| Battery 2-1 | 0.1 | 7.2 | 87 | 51 |
| Battery 2-2 | 0.2 | 7.0 | 84 | 73 |
| Battery 2-3 | 0.9 | 2.4 | 63 | 91 |
| Battery 2-4 | 1.1 | 2.2 | 57 | 92 |

As can be understood from Table 2, the capacity retention rate was improved when the oxygen ratio x was high. However, it was found that, as the oxygen ratio x increases, the initial capacity and the charge/discharge efficiency tend to decrease. On the other hand, when the oxygen ratio x was low, the initial capacity and the charge/discharge efficiency were high but the capacity retention rate was low. It was found that the balance between the initial capacity and the charge/discharge efficiency and the cycle characteristics was good when the oxygen ratio x in $SiO_x$ was in the range from 0.2 to 0.9.

EXAMPLE 3

(Battery 3)
In this example, a negative electrode active material having carbon nanofibers (CNFs) carried on its surface was produced by a method described below.

1 g of iron nitrate enneahydrate (guaranteed, available from Kanto Chemical Co., Inc.) was dissolved in 100 g of ion-exchange water. The obtained solution was mixed with the negative electrode active material used in battery 1. The mixture was agitated for 1 hour. The water content was thereafter removed from the mixture by an evaporator to provide iron nitrate containing Fe serving as a catalyst element on the surface of the negative electrode active material. The amount of iron nitrate carried thereon was 0.5 parts by weight per 100 parts by weight of the active material.

The negative electrode active material on which iron nitrate was carried was put in a ceramic reaction container and heated to 500° C. in the presence of helium gas. Thereafter, the helium gas in the reaction container was replaced with a mixture gas of 50% by volume of hydrogen gas and 50% by volume of carbon monoxide gas. The negative electrode active material was further heated at 500° C. for 1 hour. Carbon nanofibers in a plate form having a fiber diameter of 80 nm and a fiber length of 50 μm were thereby grown on the surface of the negative electrode active material. Finally, the mixture gas in the reaction container was replaced with helium gas, followed by cooling until the temperature in the reaction container become equal to room temperature. The amount of carbon nanofibers borne on the surface of the negative electrode active material was 30 parts by weight per 100 parts by weight of the negative electrode active material.

The iron nitrate particles carried on the negative electrode active material particles were reduced to iron particles having a particle size of about 100 nm. Each of the fiber diameter and fiber length of the carbon nanofibers and the particle size of the iron particles was measured with a scanning electron microscope (SEM). The amount of carbon nanofibers carried on the surface of the negative electrode active material was obtained by subtracting the weight of the negative electrode active material before the growth of the carbon nanofibers from the weight of the negative electrode active material having the carbon nanofibers carried on its surface.

Battery 3 was made in the same manner as battery 1 except that the negative electrode active material having the carbon nanofibers carried on its surface was used.

The initial capacity, the change/discharge efficiency and the capacity retention rate of battery 3 were measured in the same manner as in EXAMPLE 1. Table 3 shows the obtained results. The results of battery 1 are also shown in Table 3.

TABLE 3

|  | Initial capacity (mAh) | Charge/discharge efficiency (%) | Capacity retention rate (%) |
| --- | --- | --- | --- |
| Battery 1 | 3.6 | 72 | 85 |
| Battery 3 | 3.6 | 87 | 98 |

From the results shown in Table 3, it was confirmed that battery 3 had improved cycle characteristics in comparison with battery 1. This is thought to be because the carbon nanofibers stably maintained the conductivity by expanding and contracting according to the change in volume when silicon oxide particles expanded and shrank. It can, therefore, be understood that deterioration in cycle characteristics can be prevented by using the carbon nanofiber even in a case where a silicon oxide having a low oxygen ratio and a large expansion coefficient is used as a negative electrode active material.

EXAMPLE 4

In this example, the average particle size of a negative electrode active material was changed.
(Batteries 4-1 to 4-4)
Batteries 4-1 to 4-4 were made in the same manner as battery 1 except that the average particle size of a negative electrode active material was set to 0.5 μm, 10 μm, 20 μm or 30 μm.

The initial capacities, the change/discharge efficiencies and the capacity retention rates of battery 4-1 to 4-4 were measured in the same manner as in EXAMPLE 1. Table 4 shows the obtained results.

TABLE 4

|  | Average particle size (μm) | Initial capacity (mAh) | Capacity retention rate (%) |
| --- | --- | --- | --- |
| Battery 4-1 | 0.5 | 3.7 | 89 |
| Battery 4-2 | 10 | 3.6 | 81 |
| Battery 4-3 | 20 | 3.6 | 75 |
| Battery 4-4 | 30 | 3.6 | 65 |

From the results shown in Table 4, it was confirmed that the cycle characteristics of the battery was improved when the average particle size of the negative electrode active material was in the range from 0.5 to 20 μm.

In battery 4-4 in which the average particle size of the negative electrode active material was 30 μm, a considerable deterioration in cycle characteristics was recognized. This is thought to be because the negative electrode active material particles cracked due to large expansion/shrinkage of the negative electrode active material particles during charge/discharge to cause abrupt reductions in current collecting performance among the active material particles and of the active material and the collector.

When the average particle size of the negative electrode active material was smaller than 0.5 μm, the pulverization conditions were not optimized and the yield in the classification process was reduced. Also, when the average particle size was smaller than 0.5 μm, a problem that the viscosity of the paste was increased or the like arose. Therefore, it is appropriate to set the average particle size to 0.5 μm or greater.

As can be understood from the above-described results, it is appropriate to set the average particle size in the range from 0.5 to 20 μm.

EXAMPLE 5

In this example, oxygen gas was converted to plasma when a negative electrode active material was produced.
(Battery 5)
A vapor deposition apparatus arranged as shown in FIG. 1 and provided with a device for converting oxygen gas to plasma was used. An electron beam (EB) radiation device was used as the device for converting oxygen gas to plasma. Silicon was used as a target. The oxygen gas flow rate was set to 100 sccm; the acceleration voltage of the EB heater for heating the silicon target to −8 kV; the emission of the electron beam of this heater to 500 mA; the acceleration voltage of the EB radiation device to −4 kV; and the emission of the electron beam of this device to 20 mA. The pressure of oxygen gas in the vacuum chamber was $2.8 \times 10^{-4}$ Torr.

A silicon oxide was deposited on a substrate for 30 minutes under these conditions. The thickness of the silicon oxide layer formed was the same as the silicon oxide layer used in battery 1. Using the resultant silicon oxide layer, the negative electrode active material was produced in the same manner as described above.

The composition of the obtained negative electrode active material was obtained in the same manner as described above. The composition was $SiO_{0.7}$.

Battery 5 was made in the same manner as battery 1 by using the negative electrode active material obtained as described above.

The initial capacity, the change/discharge efficiency and the capacity retention rate of battery 5 were measured in the same manner as in EXAMPLE 1. Table 5 shows the obtained results. The results of battery 1 are also shown in Table 5.

TABLE 5

| | Initial capacity (mAh) | Charge/discharge efficiency (%) | Capacity retention rate (%) |
| --- | --- | --- | --- |
| Battery 1 | 3.6 | 72 | 85 |
| Battery 5 | 3.5 | 84 | 85 |

As shown in Table 5, battery 5 has substantially the same performance as battery 1. It can be understood that if oxygen gas is converted to plasma, the negative electrode active material can be produced in a shorter time period in comparison with battery 1.

EXAMPLE 6

In this example, a negative electrode active material was produced by a sputtering apparatus instead of the vapor deposition apparatus.
(Battery 6)
In this example, a sputtering apparatus (available from ULVAC, Inc.) shown in FIG. 2 provided with a gas piping (not shown) for introducing oxygen gas into the vacuum chamber, an oxygen nozzle and other components was used.

In this example, a negative electrode active material was produced basically in the same manner as in EXAMPLE 1.

As a sputtering gas, argon gas having a purity of 99.999% (available from Nippon Sanso Corporation) was used. The argon gas flow rate was set to 100 sccm.

As a target 15, monocrystalline silicon having a purity of 99.9999% (available from Shin-Etsu Chemical Co., Ltd.) was used. The output from a alternating current power supply when sputtering of the target 15 was performed was set to 2 kW.

The pressure in the vacuum chamber after introduction of argon gas was 0.009 Torr.

Oxygen gas having a purity of 99.7% (available from Nippon Sanso Corporation) was used as oxygen atmosphere. The oxygen gas flow rate from the oxygen nozzle 13 was set to 10 sccm. A mass flow controller was provided between an oxygen bomb and the gas piping led to the interior of the vacuum chamber. The oxygen nozzle 13 was connected to the gas piping. The pressure in the vacuum chamber after introduction of argon gas and oxygen gas was 0.01 Torr, and the partial pressure of oxygen gas was about 0.001 Torr.

A silicon oxide was formed on a substrate under the above-described conditions. The obtained silicon oxide was separated from the substrate, pulverized and classified to obtain a negative electrode active material. The average particle size of the obtained negative electrode active material was 10 μm.

The composition of the obtained negative electrode active material was obtained in the same manner as described above. The composition was $SiO_{0.7}$.

Battery 6 was made in the same manner as battery 1 by using the obtained negative electrode active material.

The initial capacity, the change/discharge efficiency and the capacity retention rate of battery 6 were measured in the same manner as in EXAMPLE 1. Table 6 shows the obtained results. The results of battery 1 are also shown in Table 6.

TABLE 6

| | Initial capacity (mAh) | Charge/discharge efficiency (%) | Capacity retention rate (%) |
| --- | --- | --- | --- |
| Battery 1 | 3.6 | 72 | 85 |
| Battery 6 | 3.6 | 85 | 83 |

As can be understood from Table 6, battery 6 has the same performance as battery 1. It can be understood from the above that both use of the vapor deposition apparatus and use of the sputtering apparatus enable production of negative electrode active materials equivalent in performance to each other.

As described above, the present invention provides a negative electrode active material for a lithium ion secondary battery having a high capacity and having improved cycle characteristics.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:
1. A method for producing a silicon oxide, wherein:
a vapor deposition apparatus is utilized, the vapor deposition apparatus comprising a vacuum chamber, a gas supply inlet for supplying an oxygen-containing gas into the vacuum chamber, a pressure reduction outlet for reducing pressure inside the vacuum chamber and an electron beam heater, and the method comprises steps of:
- (a1) disposing a metal substrate and a target essentially consisting of silicon inside the vacuum chamber;
- (a2) creating an oxygen atmosphere by supplying the oxygen-containing gas from the gas supply inlet, while reducing pressure inside the vacuum chamber;
- (a3) heating the target with the electron beam heater for evaporating silicon atoms from the target;
- (a4) forming a silicon oxide layer on the substrate by reaction between the evaporated silicon atoms and oxygen in the oxygen atmosphere; and
- (b) obtaining silicon oxide particles by separating the silicon oxide layer from the substrate and then pulverizing the separated silicon oxide layer, wherein a molar ratio of oxygen atoms to silicon atoms in the silicon oxide particles is 0.2 to 0.9.

2. The method of claim 1, wherein:
the vapor deposition apparatus further comprises, inside the vacuum chamber a unit for converting the oxygen-containing gas into plasma, and
the method further includes, before the step (b), a step (c) of converting the oxygen-containing gas into plasma.

3. The method of claim 1, wherein an average particle size of the silicon oxide particles is 0.5 to 20 µm.

4. The method of claim 1, wherein said target consisting of silicon has a purity of 99.9999%.

5. The method of claim 1, wherein the metal substrate has a high melting point.

6. The method of claim 1, wherein the metal substrate includes iron or steel.

* * * * *